United States Patent
Ichiroku et al.

(10) Patent No.: US 6,949,619 B2
(45) Date of Patent: Sep. 27, 2005

(54) PHENOLIC HYDROXYL-BEARING POLYIMIDE RESIN, MAKING METHOD AND POLYIMIDE RESIN COMPOSITION

(75) Inventors: Nobuhiro Ichiroku, Gunma-ken (JP); Masachika Yoshino, Aichi-ken (JP); Hideki Akiba, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 17 days.

(21) Appl. No.: 10/621,527

(22) Filed: Jul. 18, 2003

(65) Prior Publication Data

US 2004/0019174 A1 Jan. 29, 2004

(30) Foreign Application Priority Data

Jul. 19, 2002 (JP) ........................................ 2002-211425

(51) Int. Cl.$^7$ .................. C08G 73/10; C08L 77/00; B32B 27/28
(52) U.S. Cl. .................. 528/353; 528/26; 528/125; 528/128; 528/170; 528/171; 528/172; 528/173; 528/176; 528/183; 528/188; 528/220; 528/229; 528/350; 525/420; 525/422; 525/423; 525/436; 428/411.1; 428/413; 428/447; 428/457; 428/458; 428/473.5; 156/329; 156/330
(58) Field of Search ................ 528/26, 125, 128, 528/170–173, 176, 183, 188, 220, 229, 350, 353, 25; 525/420–423, 436, 429–432; 428/411.1, 413, 457, 458, 447, 473.5; 156/329–330

(56) References Cited

U.S. PATENT DOCUMENTS

| | | | | |
|---|---|---|---|---|
| 5,300,627 A | * | 4/1994 | Kunimune et al. | 528/353 |
| 5,677,393 A | | 10/1997 | Ohmori et al. | |
| 5,773,509 A | * | 6/1998 | Yoshida et al. | 524/600 |
| 6,468,664 B1 | * | 10/2002 | Park et al. | 428/447 |
| 6,538,093 B2 | * | 3/2003 | Sugo et al. | 528/28 |
| 6,645,632 B2 | * | 11/2003 | Honda et al. | 428/413 |

FOREIGN PATENT DOCUMENTS

| | | |
|---|---|---|
| JP | 5-9254 A | 1/1993 |
| JP | 6-116517 A | 4/1994 |
| JP | 6-200216 A | 7/1994 |
| JP | 6-271673 A | 9/1994 |
| JP | 10-60111 A | 3/1998 |

* cited by examiner

*Primary Examiner*—P. Hampton Hightower
(74) *Attorney, Agent, or Firm*—Birch, Stewart, Kolasch & Birch, LLP

(57) ABSTRACT

A polyimide resin having phenolic hydroxyl radicals in its skeleton is prepared using a diamine bearing an aromatic ring having an amino radical attached thereto and another aromatic ring having a phenolic hydroxyl radical. The polyimide resin and a composition comprising the polyimide resin, an epoxy resin and a curing agent are suited for use as varnish, adhesive and adhesive film for which adhesion and heat resistance are required.

9 Claims, No Drawings

PHENOLIC HYDROXYL-BEARING POLYIMIDE RESIN, MAKING METHOD AND POLYIMIDE RESIN COMPOSITION

BACKGROUND OF THE INVENTION

1. Technical Field

This invention relates to polyimide resins which are suitable for use as printed circuit boards, semiconductor package adhesives and encapsulants owing to excellent properties including high bond strength, high reliability and a low modulus of elasticity. It also relates to a method of preparing the same and a composition comprising the same.

2. Prior Art

In accordance with the size reduction and function multiplication of modern electronic equipment, the wiring design for printed circuit boards and semiconductor packages aims at a higher density and further miniaturization. It would be desirable to have as the adhesive used in these applications a low modulus material having high bonding performance, reliability after moisture absorption, compliance with the high-temperature process during mounting, and capability to mitigate the thermal stress upon mounting of electronic components.

Low modulus materials have already been developed in the art by introducing a siloxane structure into polyimides and polyamide-imides which are heat resistant resins. For instance, JP-A 5-009254 and JP-A 6-116517 disclose siloxane-modified polyamide-imides. These resins, however, are insufficiently adherent to copper foil and less resistant to heat. JP-A 10-60111 and JP-A 6-271673 proposes to blend a siloxane-modified polyamide-imide with a compound having at least two maleimide radicals for improving high-temperature properties. The resulting resin composition is less adherent, especially to copper foil. U.S. Pat. No. 5,677,393 (Japanese Patent No. 3,221,756) discloses a heat resistant adhesive film comprising a polyimide silicone having phenolic hydroxyl radicals and an epoxy resin. Since phenolic hydroxyl radicals are located at sterically packed positions and thus hindered from reacting with the epoxy resin, the adhesion effect of hydroxyl radicals arising from the reaction of phenolic hydroxyl radicals with the epoxy resin is not expectable.

SUMMARY OF THE INVENTION

An object of the present invention is to provide a polyimide resin affording excellent properties including high adhesion, high reliability against humidity and a low modulus of elasticity. Another object is to provide a method of preparing the polyimide resin and a composition comprising the polyimide resin.

It has been found that a polyimide resin having phenolic hydroxyl radicals in its skeleton which is prepared using a diamine bearing an aromatic ring having an amino radical attached thereto and another aromatic ring having a phenolic hydroxyl radical is fully reactive with an epoxy resin to provide excellent performance to attain the above objects and that a polyimide resin composition comprising the above polyimide resin as an active ingredient, preferably in admixture with an epoxy resin having at least two glycidyl radicals exhibits excellent properties including high adhesion, high reliability against humidity and a low modulus of elasticity.

In a first aspect, the present invention provides a polyimide resin comprising recurring units of the following structural formulae (1) and (2) and prepared using a diamine bearing an aromatic ring having an amino radical attached thereto and another aromatic ring having a phenolic hydroxyl radical so that the polyimide resin has phenolic hydroxyl radicals in its skeleton.

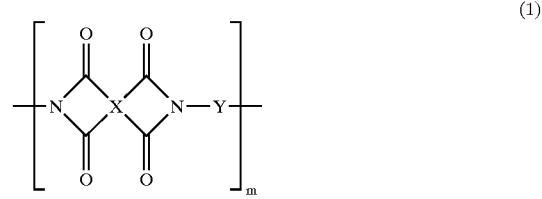

(1)

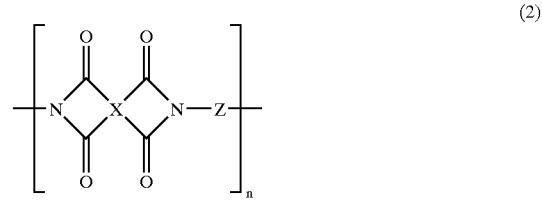

(2)

Herein X is at least one tetravalent organic radical selected from the group [I]; Y is a divalent organic radical comprising a diamine residue $Y_1$ having a phenolic hydroxyl radical represented by the formula [II] and an aromatic diamine residue $Y_2$ selected from the group [III]; Z is a siloxane diamine residue represented by the formula [IV]; $Y_1/(Y_1+Y_2)$ is from 0.01 to 1 in a molar ratio, m and n are natural numbers, satisfying $0.1 \leq m/(m+n) \leq 0.99$ and $10 \leq m+n \leq 500$.

Group (I)

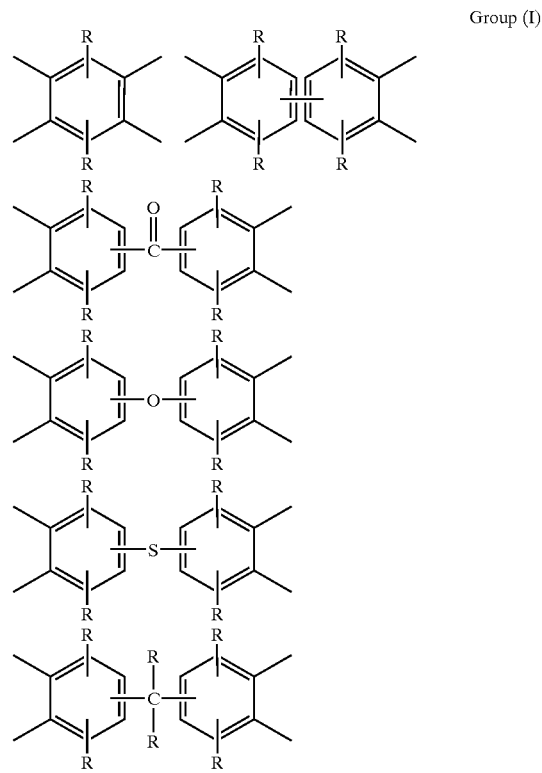

-continued
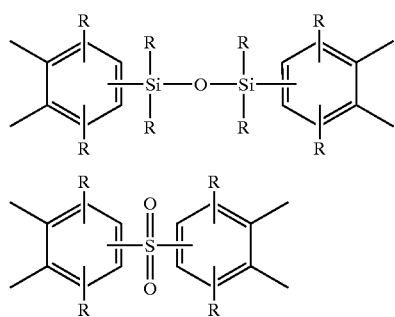
Herein R is independently a hydrogen atom, halogen atom or substituted or unsubstituted monovalent hydrocarbon radical of 1 to 8 carbon atoms.
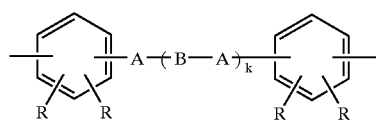
Formula (II)
Herein A is a radical selected from the group [IIa] and B is a radical selected from the group [IIb]:
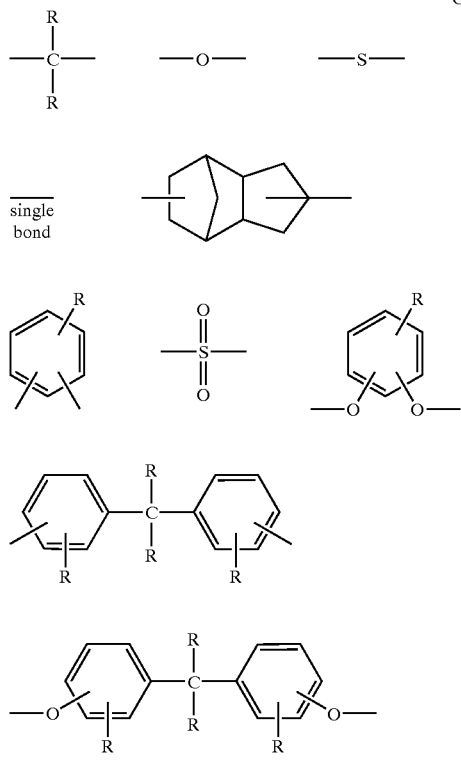
Group (IIa)
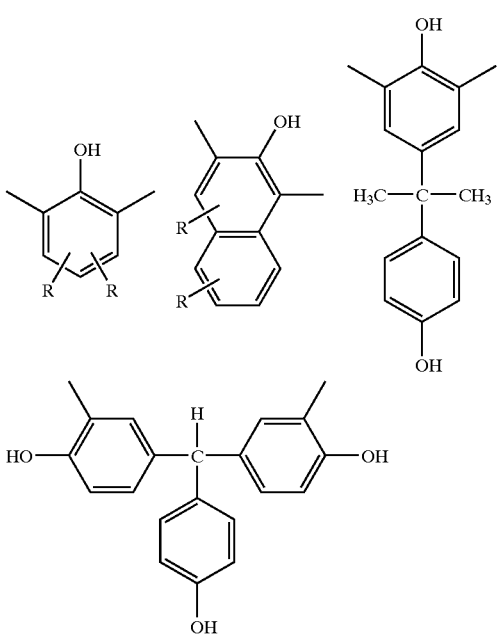
Group (IIb)
R is as defined above, and k is a natural number of 1 to 5.
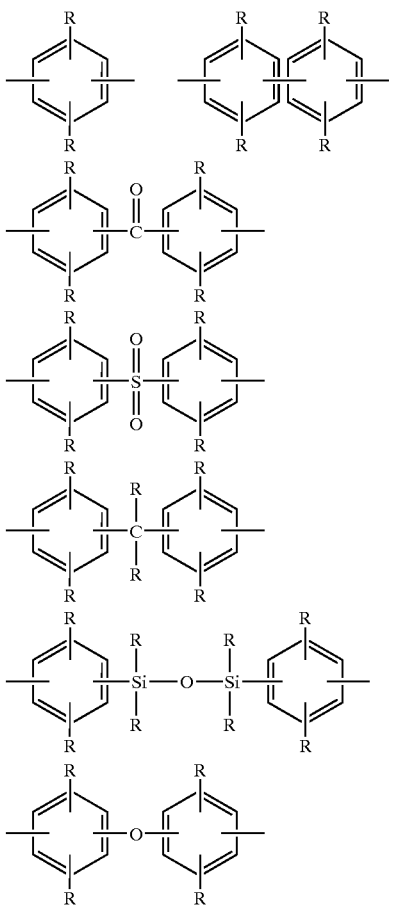
Group (III)

-continued

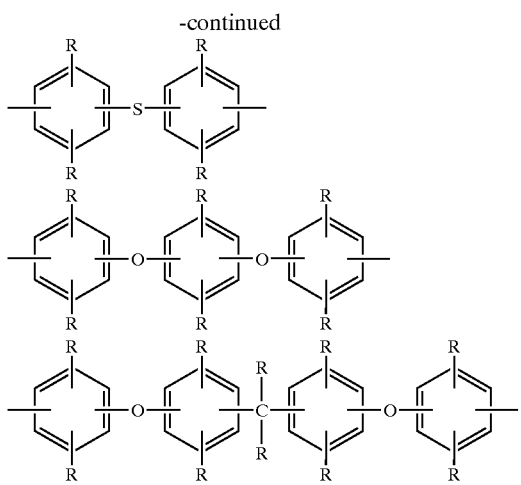

Herein R is as defined above.

Formula (IV)

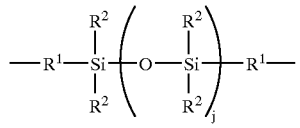

Herein $R^1$ is independently a $C_{1-8}$ alkylene or arylene radical, $R^2$ is independently a $C_{1-8}$ alkyl, alkoxy or aryl radical, and j is an integer of 4 to 60.

In a second aspect, the present invention provides a method for preparing the above polyimide resin by reacting a tetracarboxylic acid dianhydride having the general formula (3) or its precursor, a tetracarboxylic acid or ester derivative thereof with diamines having the general formulae (4), (5) and (6).

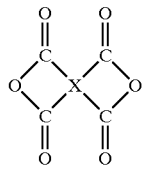  (3)

$$H_2N—Y_1—NH_2 \quad (4)$$
$$H_2N—Y_2—NH_2 \quad (5)$$
$$H_2N-Z-NH_2 \quad (6)$$

Herein X, $Y_1$, $Y_2$ and Z are as defined above. Provided that the amounts of diamines of formulae (4), (5) and (6) used are $y_1$ moles, $y_2$ moles and z moles, respectively, $y_1/(y_1+y_2)$ is from 0.01 to 1, and $(y_1+y_2)/(y_1+y_2+z)$ is from 0.1 to 0.99. The reaction is effected under such conditions as to give a molar ratio of P/Q>1 wherein P is the amino radical on the diamine of formula (4) and Q is the acid anhydride residue (or 2 equivalents of carboxylic acid radical or ester radical) on the tetracarboxylic acid dianhydride of formula (3).

A polyimide resin composition comprising the polyimide resin is also contemplated which may preferably further contain an epoxy resin having at least two glycidyl radicals, and more preferably an epoxy resin having at least two glycidyl radicals and an epoxy resin curing agent.

DETAILED DESCRIPTION OF THE INVENTION

The polyimide resin of the invention comprises recurring units of the following structural formulae (1) and (2) and has been prepared using a diamine bearing an aromatic ring having an amino radical attached thereto and another aromatic ring having a phenolic hydroxyl radical so that the polyimide resin has phenolic hydroxyl radicals in its skeleton.

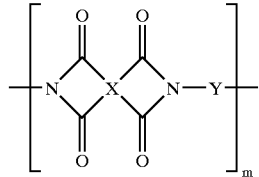  (1)

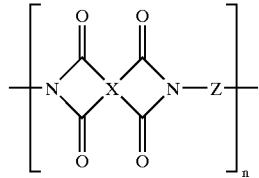  (2)

Herein X is one or more tetravalent organic radicals selected from the group [I]; Y is a divalent organic radical comprising a diamine residue $Y_1$ having a phenolic hydroxyl radical represented by the formula [II] and an aromatic diamine residue $Y_2$ selected from the group [III]; Z is a siloxane diamine residue represented by the formula [IV]; m and n are natural numbers, satisfying $10 \leq m+n \leq 500$. Preferably, the sum of m+n is from 20 to 400, m is from 1 to 495, especially from 2 to 396, n is from 5 to 499, especially from 4 to 398. The value of m/(m+n) is from 0.1 to 0.99. The value of n/(m+n) is preferably from 0.01 to 0.9, and m/n is preferably from 0.02 to 50, especially from 0.1 to 40. The proportion of $Y_1$ and $Y_2$ is such that $Y_1/(Y_1+Y_2)$ is from 0.01 to 1 and $Y_2/(Y_1+Y_1)$ is from 0 to 0.99, both in a molar ratio. Preferably, $Y_1/(Y_1+Y_2)$ is from 0.1 to 1 and $Y_2/(Y_1+Y_2)$ is from 0 to 0.9.

Group (I)

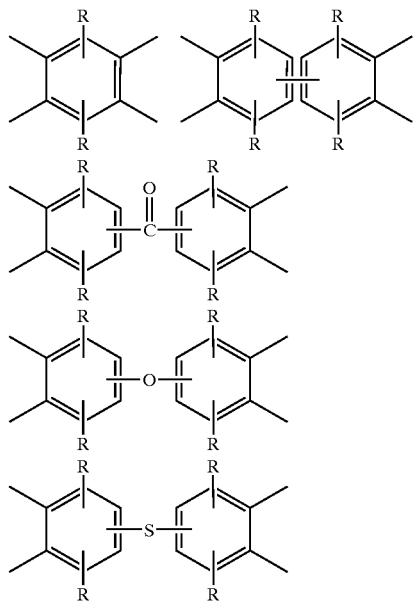

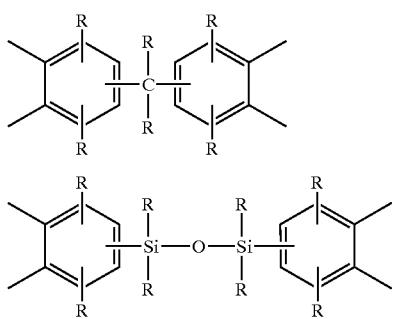
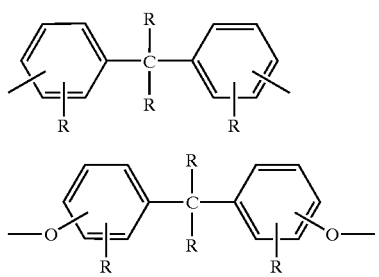
Herein R is independently a hydrogen atom, halogen atom or substituted or unsubstituted monovalent hydrocarbon radical of 1 to 8 carbon atoms.
Formula (II)
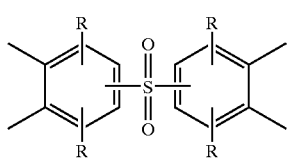
Herein A is a radical selected from the group [IIa] and B is a radical selected from the group [IIb]:
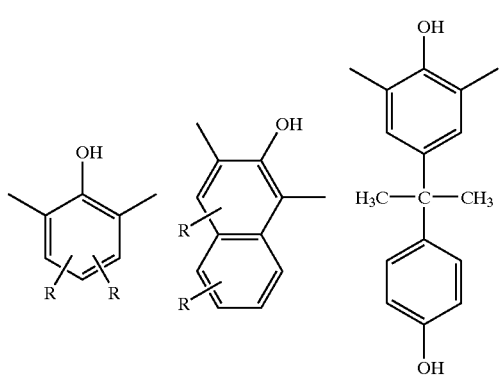
Group (IIb)
R is as defined above, and k is a natural number of 1 to 5.
Group (IIa)
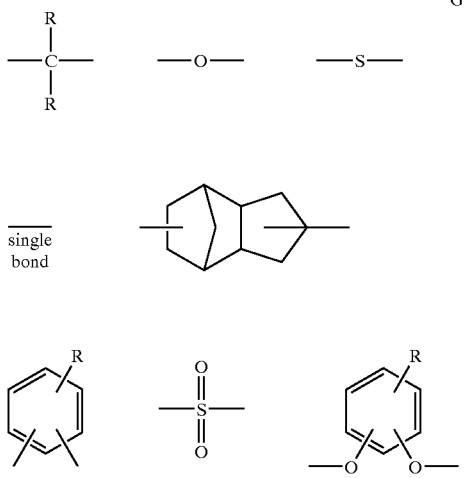
Group (III)
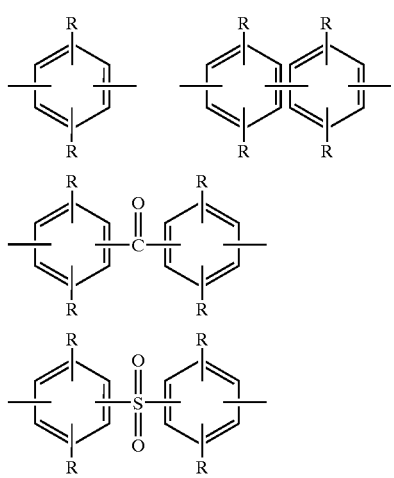

-continued

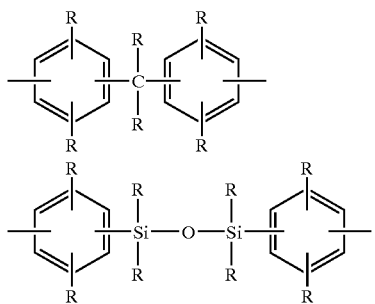

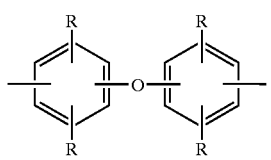

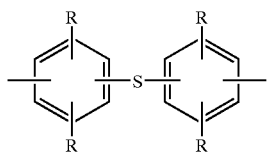

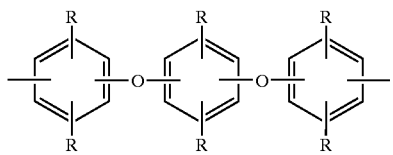

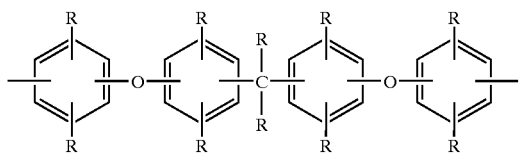

Herein R is as defined above.

Formula (IV)

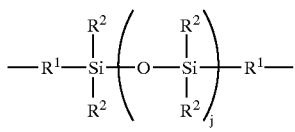

Herein $R^1$ is independently a $C_{1-8}$ alkylene or arylene radical, $R^2$ is independently a $C_{1-8}$ alkyl, alkoxy or aryl radical, and j is an integer of 4 to 60.

The halogen atoms represented by R include fluorine, bromine and iodine. The monovalent hydrocarbon radicals represented by R include alkyl, alkenyl, alkynyl, aryl radicals and substituted ones of the foregoing radicals in which some or all of the hydrogen atoms are substituted with halogen atoms such as fluorine atoms. Examples include methyl, ethyl, propyl, isopropyl, n-butyl, isobutyl, tert-butyl, hexyl, cyclohexyl, vinyl, allyl, propenyl, hexenyl, phenyl and trifluoromethyl.

Examples of the alkylene radicals represented by $R^1$ include methylene, ethylene, trimethylene, tetramethylene, and hexamethylene, and a typical arylene radical is phenylene. Exemplary of $R^2$ are alkyl radicals as enumerated above, alkoxy radicals such as methoxy, ethoxy, propoxy, and butoxy, and aryl radicals such as phenyl, tolyl, and xylyl. The subscript j is an integer of 4 to 60, preferably 5 to 40.

The polyimide resin of the invention can be prepared by reacting a tetracarboxylic acid dianhydride of the general formula (3) or its precursor, a tetracarboxylic acid or ester derivative thereof with diamines of the general formulae (4), (5) and (6).

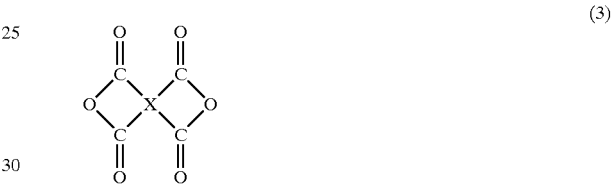 (3)

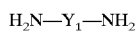 (4)

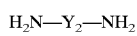 (5)

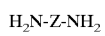 (6)

Herein X, $Y_1$, $Y_2$ and Z are as defined above. Provided that the amounts of diamines of formulae (4), (5) and (6) used are $y_1$ moles, $y_2$ moles and z moles, respectively, the proportion of $y_1/(y_1+y_2)$ is from 0.01 to 1, and the proportion of $(y_1+y_2)/(y_1+y_2+z)$ is from 0.1 to 0.99.

Typical of the tetracarboxylic acid dianhydride of formula (3) or its precursor, the tetracarboxylic acid or ester derivative thereof are tetracarboxylic acids such as pyromellitic acid, 3,3',4,4'-benzophenonetetracarboxylic acid, 2,3,3',4'-biphenyltetracarboxylic acid, bis(3,4-carboxyphenyl) sulfone, 3,3',4,4'-biphenyltetracarboxylic acid, bis[4-(3,4-dicarboxyphenoxy)phenyl]-methane, bis[4-(3,4-dicarboxyphenoxy)phenyl]-ethane, 2,2-bis[4-(3,4-dicarboxyphenoxy)phenyl]-propane, bis(3,4-dicarboxyphenyl)difluoromethane, 2,2-bis(3,4-dicarboxyphenyl)hexafluoropropane, 1,3-bis(3,4-dicarboxyphenyl)-1,1,3,3-tetratetramethylsiloxane, bis[4-(3,4-dicarboxyphenoxy)phenyl]methane, and bis(3,4-dicarboxyphenyl)ether, and dianhydrides of the foregoing and reactive derivatives of the foregoing such as esters, which may be used alone or in admixture of any.

The diamine of formula (4) is specifically illustrated as follows.

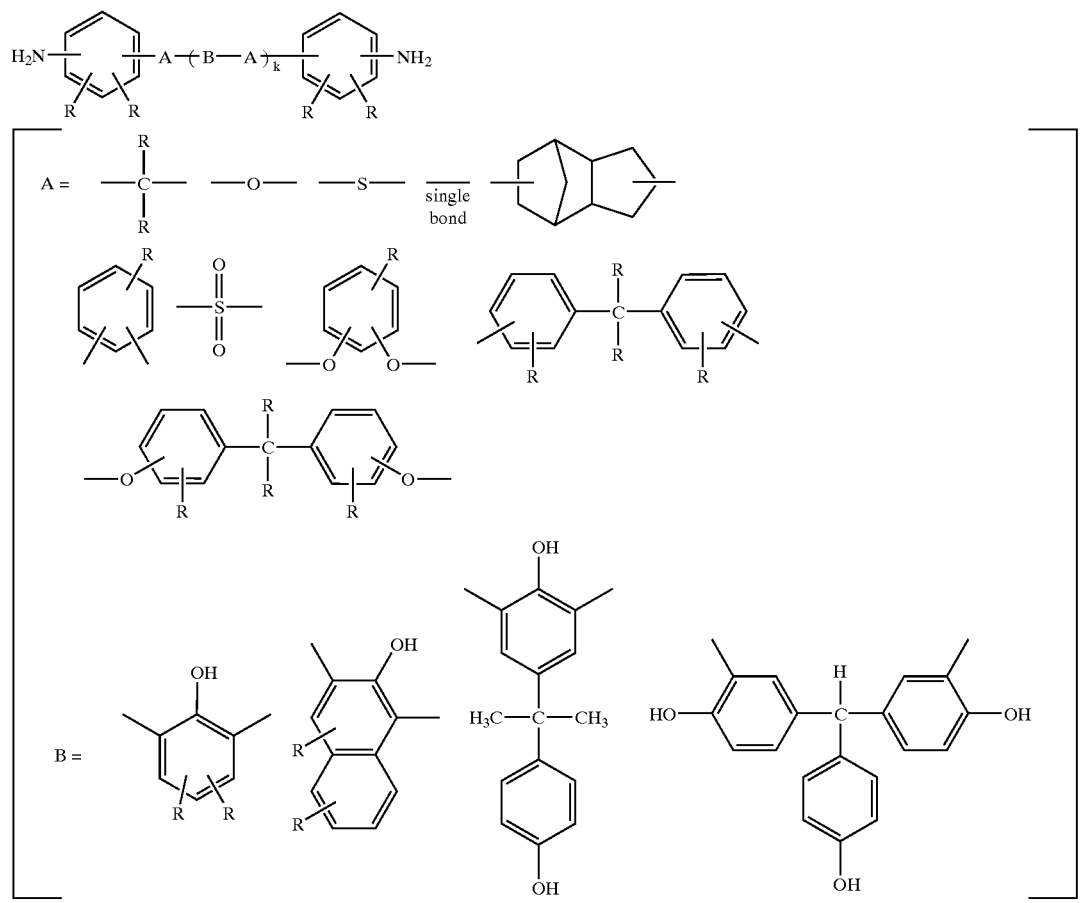

Herein R and k are as defined above. Use may be made of two or more diamines of formula (4).

The reaction should be effected under such conditions as to give a molar ratio of P/Q>1 wherein P is the amino radical on the diamine of formula (4) and Q is the acid anhydride residue (or 2 equivalents of carboxylic acid radical or ester radical) on the tetracarboxylic acid dianhydride of formula (3) or its precursor, the tetracarboxylic acid or ester derivative thereof because side reaction or esterification reaction of phenolic hydroxyl radicals with acid anhydride radicals can be restrained. The molar ratio P/Q is more preferably $2 \leq P/Q \leq 100$, and even more preferably $10 \leq P/Q \leq 100$.

The amount of the phenolic hydroxyl radical-containing diamine of formula (4) used is preferably from 1 mol % to 50 mol %, more preferably at least 5 mol %, based on the entire monomers of which the polyimide is constructed.

Examples of the diamine of formula (5) include 4,4'-diaminodiphenylmethane, o-, m- or p-phenylenediamine, bis(4-(3-aminophenoxy)phenyl)sulfone, 2,4-diaminotoluene, 2,5-diaminotoluene, 2,4-diaminoxylene, 2,4-diaminodurene, dimethyl-4,4'-diaminodiphenyl, dialkyl-4,4'-diaminodiphenyls, dimethoxy-4,4'-diaminodiphenyl, diethoxy-4,4'-diaminodiphenyl, 4,4'-diaminodiphenyl ether, 3,4'-diaminodiphenyl ether, 4,4'-diaminodiphenyl sulfone, 3,3'-diaminodiphenyl sulfone, 4,4'-diaminobenzophenone, 3,3'-diaminobenzophenone, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl)sulfone, 2,2'-bis(4-(4-aminophenoxy)phenyl)propane, 2,2-bis(4-(4-aminophenoxy)phenyl)hexafluoropropane, 2,2-bis(4-(3-aminophenoxy)phenyl)propane, 2,2-bis(4-(3-aminophenoxy)phenyl)hexafluoropropane, 2,2-bis(4-(4-amino-2-trifluoromethylphenoxy)phenyl)hexafluoropropane, 2,2-bis(4-(3-amino-5-trifluoromethylphenoxy)phenyl)hexafluoropropane, 2,2-bis(4-aminophenyl)hexafluoropropane, 2,2-bis(3-aminophenyl)hexafluoropropane, 2,2-bis(3-amino-4-hydroxyphenyl)hexafluoropropane, 2,2-bis(3-amino-4-methylphenyl)hexafluoropropane, 4,4'-bis(4-aminophenoxy)octafluorobiphenyl, 2,2'-bis(trifluoromethyl)diaminodiphenyl, 3,5-diaminobenzotrifluoride, 2,5-diaminobenzotrifluoride, 3,3'-bistrifluoromethyl-4,4'-diaminobiphenyl, 3,3'-bistrifluoromethyl-5,5'-diaminobiphenyl, bis(trifluoromethyl)-4,4'-diaminodiphenyl, bis(fluorinated alkyl)-4,4'-diaminodiphenyls, dichloro-4,4'-diaminodiphenyl, dibromo-4,4'-diaminodiphenyl, bis(fluorinated alkoxy)-4,4'-diaminodiphenyls, diphenyl-4,4'-diaminodiphenyl, 4,4'-bis(4-aminotetrafluorophenoxy)tetrafluorobenzene, 4,4'-bis(4-aminotetrafluorophenoxy)octafluorobiphenyl, 4,4'-binaphthylamine, 4,4'-diaminobenzanilide, and 4,4'-diamino(N-alkyl)benzanilides, alone or in admixture of any.

The diamine of formula (4) and the diamine of formula (5) are used in such a proportion (the proportion of $Y_1$ and $Y_2$ in the structural formula) that $Y_1/(Y_1+Y_2)$ is 1 to 100 mol % (a molar ratio between 0.01 and 1), and $Y_2/(Y_1+Y_2)$ is 0 to 99 mol % (a molar ratio between 0 and 0.99) and preferably $Y_1/(Y_1+Y_2)$ is 10 to 100 mol %, and $Y_2/(Y_1+Y_2)$ is 0 to 90 mol %. If $Y_1/(Y_1+Y_2)$ is less than 1 mol %, good adhesion to a substrate will not develop.

The diamine of formula (6) is specifically illustrated as follows.

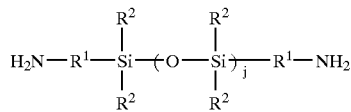

Herein $R^1$, $R^2$ and j are as defined above. Examples include 1,3-bis(3-aminopropyl)-1,1,2,2-tetramethyldisiloxane, 1,3-bis(3-aminobutyl)-1,1,2,2-tetramethyldisiloxane, bis(4-aminophenoxy)dimethylsilane, and 1,3-bis(4-aminophenoxy)tetramethyldisilane. The amount of diaminosiloxane component of formula (6) used in the preparation of the inventive polyimide resin is preferably 1 to 50 mol % based on the entire monomers of which the polyimide is constructed, more preferably 2 to 40 mol % based on the entire monomers. If the amount of diaminosiloxane component is less than 1 mol %, an effect of imparting flexibility may be lost. More than 50 mol % of the diaminosiloxane component results in an increase of moisture permeability and a reduction of heat resistance.

Preparation of the polyimide resin having phenolic hydroxyl radicals in its skeleton according to the invention can be carried out by previously dispersing or dissolving a di- or polyfunctional amine component having a phenolic hydroxyl radical or a mixture of a di- or polyfunctional amine component having a phenolic hydroxyl radical and a di- or polyfunctional amine component free of a phenolic hydroxyl radical in a reactor, dissolving or dispersing a di- or polyfunctional acid anhydride component in a solvent, adding dropwise the acid anhydride component to the reactor at a low temperature, and stirring the contents, followed by heating.

The solvents used for the polyimide preparation include commonly used amide solvents having a greater dissolving power such as N-methylpyrrolidone, N,N-dimethylformamide and N,N-dimethylacetamide; and oxygen-containing solvents, for example, lactones such as γ-butyrolactone, α-methyl-γ-butyrolactone, γ-valerolactone, δ-valerolactone, γ-caprolactone, and ε-caprolactone, carbonates such as ethylene carbonate and propylene carbonate, esters such as butyl cellosolve acetate, ethyl cellosolve acetate and butyl cellosolve acetate, ethers such as dibutyl ether, diethylene glycol dimethyl ether and triethylene glycol dimethyl ether, ketones such as methyl isobutyl ketone, cyclohexanone and acetophenone, alcohols such as butanol, octanol and ethyl cellosolve. Furthermore any of chain-like or cyclic amide, urea, sulfoxide, sulfone, hydrocarbon, and halide solvents may be added insofar as it does not affect the stability of polyimide being formed.

In the process of reacting the diamines with the tetracarboxylic acid dianhydride, a phenolic hydroxyl radical-free diamine is first reacted with a tetracarboxylic acid dianhydride in a solvent as listed above to form an amic acid oligomer. Since the inventive polyimide resin contains acid anhydride and amine in a molar ratio of approximately 1:1, the amic acid oligomer which does not contain a phenolic hydroxyl radical-containing diamine is an oligomer which is rich in the acid anhydride and terminated with an acid anhydride radical. The solution of the acid anhydride-terminated amic acid oligomer is added dropwise to a phenolic hydroxyl radical-containing diamine so that the ratio of diamine/acid anhydride in the solution may not exceed 1, to thereby form a polyamic acid having phenolic hydroxyl radicals which is a precursor to a phenolic hydroxyl radical-bearing polyimide resin.

Subsequently, the polyamic acid solution is heated to a temperature in the range of 80 to 250° C., preferably 120 to 200° C., to induce dehydrating ring-closing reaction on the amide moiety of polyamic acid, yielding a polyimide resin solution. Alternatively, the polyimide may be prepared by adding an acetic anhydride/pyridine mixed solution to the polyamic acid solution, then heating the resulting mixture to about 50° C. and carrying out imidization.

For the following reason, the rate of addition is controlled such that the ratio of diamine/acid anhydride in the solution may not exceed 1. If a phenolic hydroxyl radical-containing diamine is added dropwise under acid anhydride-rich conditions, then not only amide formation takes place through the reaction of carboxylic acid with amine, but also esterification reaction occurs simultaneously through the reaction of carboxylic acid with phenolic hydroxyl radicals, to induce three-dimensional crosslinking, resulting in a gel. Since the gel product has an ester bond structure, it undergoes hydrolytic reaction under hot humid conditions to degrade into lower molecular weight compounds, leading to a loss of reliability against humidity.

To prevent esterification reaction of phenolic hydroxyl radicals with the acid anhydride-terminated amic acid oligomer in the solution, the amic acid oligomer is preferably converted into an acid anhydride-terminated imide oligomer through dehydrating ring-closing reaction.

To prevent ester formation through reaction of phenolic hydroxyl radicals with acid anhydride radicals, capping of phenolic hydroxyl radicals with protective radicals is possible, but undesirable in the industrial application because of the extra steps introduced and the increased expense of capping reagent.

The polyimide resin of the invention thus obtained preferably has a weight average molecular weight of about 500 to 200,000, more preferably about 1,000 to 100,000, especially about 1,000 to 50,000.

There has been described a polyimide resin having phenolic hydroxyl radicals in its skeleton owing to preparation using a diamine having an amino radical attached to an aromatic ring (typically, benzene ring) and a phenolic hydroxyl radical on another aromatic ring (typically, benzene or naphthalene ring). When this polyimide resin is compounded with an epoxy resin having at least two glycidyl radicals and preferably a curing agent, the resulting polyimide resin composition has a low modulus of elasticity and exhibits good adhesion and reliability. By applying the polyimide resin composition to a substrate as a varnish, a coating or film having good adhesion to copper foil or the like is obtainable.

The epoxy resin having at least two glycidyl radicals used herein is not critical. Useful examples are glycidyl type (inclusive of methyl glycidyl type) epoxy resins including glycidyl ethers of phenols such as bisphenol A, bisphenol F, resorcinol, phenol novolac, and cresol novolac, glycidyl ethers of alcohols such as butane diol, polyethylene glycol and polypropylene glycol, glycidyl ethers of carboxylic acids such as phthalic acid, isophthalic acid, and tetrahydrophthalic acid, and derivatives of aniline, isocyanuric acid and the like in which active hydrogen attached to a nitrogen atom is substituted with a glycidyl radical; alicyclic epoxy resins obtained by epoxidizing an olefin bond within the molecule such as vinylcyclohexene diepoxide, 3,4-epoxycyclohexylmethyl-3,4-epoxycyclohexane carboxylate, and 2-(3,4-epoxy)cyclohexyl-5,5-spiro(3,4-epoxy)cyclohexane-m-dioxane; glycidyl ethers of p-xylylene-modified phenolic resins, glycidyl ethers of m-xylylene/p-xylylene-modified phenolic resins, glycidyl ethers of terpene-modified phenolic resins, glycidyl ethers of dicyclopentadiene-modified phenolic resins, glycidyl ethers of cyclopentadiene-modified phenolic resins, glycidyl ethers of polycyclic aromatic ring-modified phenolic resins, glycidyl ethers of naphthalene ring-containing phenolic resins, and biphenyl type epoxy resins. They may be used alone or in admixture of any.

The epoxy resin curing agent used herein is not critical as long as it serves as an agent for curing the epoxy resin. Exemplary curing agents are phenolic compounds, acid anhydrides and amine compounds, with the phenolic compounds being preferred. Examples of the phenolic compounds include resins obtained by condensation or co-condensation of a phenol (e.g., phenol, cresol, xylenol, hydroquinone, resorcinol, catechol, bisphenol A or bisphenol F) or a naphthol (e.g., α-naphthol, β-naphthol or dihydroxynaphthalene) with an aldehyde (e.g., formaldehyde, acetaldehyde, propionaldehyde, benzaldehyde or salicylaldehyde) in the presence of an acidic catalyst; phenolic resins having a xylylene skeleton synthesized from a phenol and dimethoxy-p-xylene or the like; phenolic resins having a dicyclopentadiene skeleton; phenolic resins having a cyclopentadiene skeleton; melamine-modified phenolic resins; terpene-modified phenolic resins; polycyclic aromatic ring-modified phenolic resins; naphthol resins having a xylylene skeleton, and the like, alone or in admixture of any.

The curing agent is used in an effective cure amount which varies with a particular type. Usually, the amount of the curing agent is 1 to 100 parts by weight, preferably 5 to 50 parts by weight per 100 parts by weight of the epoxy resin. Less than 1 pbw of the curing agent is insufficient for the composition to cure effectively. More than 100 pbw of the curing agent leads to disadvantages including an economical loss, a long time taken for curing of the epoxy resin because of dilution, and poor physical properties of cured products.

In the practice of the invention, a curing catalyst for epoxy resins may be used. Useful curing catalysts are phosphorus catalysts and amine catalysts, thought not limited thereto. Suitable phosphorus catalysts include triphenylphosphine, triphenylphosphonium triphenylborate, tetraphenylphosphonium tetraphenylborate, and compounds of the following formula.

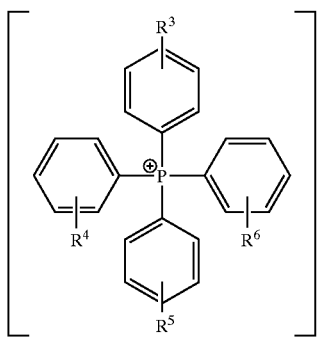

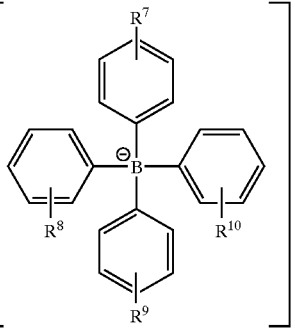

Herein $R^3$ to $R^{10}$ are selected from among hydrogen, halogen atoms (e.g., fluorine, bromine and iodine), $C_{1-8}$ alkyl, alkenyl, alkynyl, $C_{1-8}$ alkoxy, trifluoromethyl and phenyl radicals. All these substituent radicals may be the same or different.

Suitable amine catalysts include imidazole derivatives such as 2-methylimidazole, 2-ethyl-4-methylimidazole, 1-cyanoethyl-2-methylimidazole and 2-phenyl-4,5-dihydroxy-methylimidazole. The curing catalysts may be used alone or in admixture of any.

The chemical equivalent ratio of the sum of the epoxy resin curing agent and the polyimide resin having phenolic hydroxyl radicals in its skeleton to the epoxy resin is preferably set in the range between 0.7 and 1.3, more preferably between 0.8 and 1.2, though not critical. Within this range, unreacted residues of the respective components can be minimized and the degradation with time of adhesive strength, water absorption and electrical properties can be retarded.

The compounding proportion of the polyimide resin having phenolic hydroxyl radicals in its skeleton, the epoxy resin and the epoxy resin curing agent is of importance. In the inventive composition, curing reaction takes place utilizing the reaction of phenolic hydroxyl radicals with epoxy radicals. If too less epoxy radicals are available, adhesion to an adherend becomes insufficient. If too much epoxy radicals are available, the excess of epoxy resin increases the modulus of elasticity, which is inconvenient to form a flexible polyimide resin composition. Therefore, a mixture of the epoxy resin and the epoxy resin curing agent is used in an amount of 1 to 900 parts by weight, preferably 5 to 400 parts by weight per 100 parts by weight of the polyimide resin.

The amount of the epoxy resin curing catalyst added is usually up to 40 parts by weight (0 to 40 parts by weight), preferably 0.01 to 40 parts by weight, more preferably 0.1 to 20 parts by weight per 100 parts by weight of the epoxy resin and the epoxy resin curing agent combined. Too small an amount of the curing catalyst may require a long time for curing or lead to under-cure. Too large an amount of the curing catalyst may adversely affect the shelf stability of the composition.

The polyimide resin composition of the invention is desirably prepared by combining the above components and thoroughly mixing them for a time of at least 5 minutes in order to prevent separation of the components. The thus prepared polyimide resin composition is dissolvable in an aprotic polar solvent such as cyclohexanone or NMP and ready for use as varnish.

The polyimide resin composition of the invention is coated to a substrate to form a coating or film having good adhesion to copper foil or the like. The coating is usually cured by heating at 160° C. or higher, preferably at 200° C. or higher.

EXAMPLE

Examples of the invention are given below by way of illustration and not by way of limitation. All parts are by weight. Mw is a weight average molecular weight, GPC is gel permeation chromatography, and Tg is a glass transition temperature.

Synthesis Example 1

A 1-liter separable flask equipped with a 25-ml water metering receiver coupled to a reflux condenser through a cock, a thermometer and a stirrer was charged with 44.03 parts of a linear dimethylpolysiloxane blocked with a γ-aminopropyldimethylsiloxy radical at each end of the molecular chain, KF-8010 (Shin-Etsu Chemical Co., Ltd.) and 100 parts of cyclohexanone as a reaction solvent. By stirring at 80° C., the diamine was dispersed. A solution of 38.72 parts of 6FDA (2,2-bis(3,4-dicarboxyphenyl) hexafluoropropane) as an acid anhydride in 100 parts of cyclohexanone was added dropwise to the dispersion. The solution was stirred for 8 hours at 80° C. for reaction, thereby synthesizing an acid anhydride-rich amic acid oligomer.

Next, a 1-liter separable flask equipped with a 25-ml water metering receiver coupled to a reflux condenser through a cock, a thermometer and a stirrer was charged with 17.25 parts of a phenolic hydroxyl radical-containing aromatic diamine (Diamine 1) shown below and 100 parts of cyclohexanone, which were dispersed. The acid anhydride-rich polyamic acid solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

Diamine 1

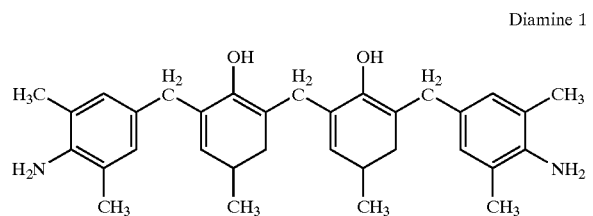

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 30,000 (polystyrene basis). Tg was 115° C. on thermo-mechanical analysis.

Synthesis Example 2

A 1-liter separable flask equipped with a 25-ml water metering receiver coupled to a reflux condenser through a cock, a thermometer and a stirrer was charged with 44.03 parts of a linear dimethylpolysiloxane blocked with a γ-aminopropyldimethylsiloxy radical at each end of the molecular chain, KF-8010 (Shin-Etsu Chemical Co., Ltd.) and 100 parts of cyclohexanone as a reaction solvent. By stirring at 80° C., the diamine was dispersed. A solution of 38.72 parts of 6FDA (2,2-bis(3,4-dicarboxyphenyl) hexafluoropropane) as an acid anhydride in 100 parts of cyclohexanone was added dropwise to the dispersion. The solution was stirred for 8 hours at 80° C. for reaction, thereby synthesizing an acid anhydride-rich amic acid oligomer.

Then 25 ml of toluene was admitted into the flask, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C., yielding an acid anhydride-rich imide solution.

Next, a 1-liter separable flask equipped with a 25-ml water metering receiver coupled to a reflux condenser through a cock, a thermometer and a stirrer was charged with 17.25 parts of the phenolic hydroxyl radical-containing aromatic diamine (Diamine 1) shown above and 100 parts of cyclohexanone, which were dispersed. The acid anhydride-rich imide solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 32,000 (polystyrene basis). Tg was 120° C. on thermo-mechanical analysis.

Synthesis Example 3

A 1-liter separable flask equipped with a 25-ml water metering receiver coupled to a reflux condenser through a cock, a thermometer and a stirrer was charged with 17.25 parts of the phenolic hydroxyl radical-containing aromatic diamine (Diamine 1) shown above, 44.03 parts of a linear dimethylpolysiloxane blocked with a γ-aminopropyldimethylsiloxy radical at each end of the molecular chain, KF-8010 (Shin-Etsu Chemical Co., Ltd.) and 200 parts of cyclohexanone as a reaction solvent. By stirring at 80° C., the diamines were dispersed. A solution of 38.72 parts of 6FDA (2,2-bis(3,4-dicarboxyphenyl) hexafluoropropane) as an acid anhydride in 100 parts of cyclohexanone was added dropwise to the dispersion. The solution was stirred for 8 hours at 80° C. for reaction whereupon a gel formed. Toluene, 25 ml, was then admitted, after which the temperature was elevated to about 160° C., at which reflux continued for 2 hours. It was confirmed that a predetermined amount of water collected in the water metering receiver and no outflow of water was observed.

While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

The infrared absorption spectrum of the polyimide resin was measured. Absorption peaks attributable to amic acid and indicating the presence of unreacted functional radicals developed at 3200 cm$^{-1}$ and 3300 cm$^{-1}$. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 25,000 (polystyrene basis). Tg was 100° C. on thermo-mechanical analysis.

Synthesis Examples 4–7

By following the procedure of Synthesis Example 1 except that either one or both of diamines, a linear dimethylpolysiloxane blocked with a γ-aminopropyldimethylsiloxy radical at each end of the molecular chain, KF-8010 (Shin-Etsu Chemical Co., Ltd.) and an aromatic diamine BAPP (2,2-bis[4-(4-aminophenoxy)phenyl]propane) were dissolved in 200 parts of cyclohexanone, a polyamic acid was first synthesized from a phenolic hydroxyl radical-free diamine and an acid anhydride (Synthesis Example 7). The polyamic acid was then added dropwise to a solution of a phenolic hydroxyl radical-containing diamine (Diamine 1 in Synthesis Examples 4 and 5, and an aromatic diamine having both a phenolic hydroxyl radical and an amino radical attached to a common aromatic ring, HAB (4,4'-(3, 3'-dihydroxy)diaminobiphenyl) in Synthesis Example 6), synthesizing a polyamic acid having phenolic hydroxyl radicals. This was processed as in Synthesis Example 1, obtaining a cyclohexanone solution of polyimide resin.

Synthesis Example 8

A 1-liter separable flask equipped with a 25-ml water metering receiver coupled to a reflux condenser through a cock, a thermometer and a stirrer was charged with 42.95 parts of a linear dimethylpolysiloxane blocked with a γ-aminopropyldimethylsiloxy radical at each end of the molecular chain, KF-8010 (Shin-Etsu Chemical Co., Ltd.) and 100 parts of cyclohexanone as a reaction solvent. By stirring at 80° C., the diamine was dispersed. A solution of 37.78 parts of 6FDA (2,2-bis(3,4-dicarboxyphenyl)hexafluoropropane) as an acid anhydride in 100 parts of cyclohexanone was added dropwise to the dispersion. The solution was stirred for 8 hours at 80° C. for reaction, thereby synthesizing an acid anhydride-rich amic acid oligomer.

Then 25 ml of toluene was admitted into the flask, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C., yielding an acid anhydride-rich imide solution.

Next, a 1-liter separable flask equipped with a 25-ml water metering receiver coupled to a reflux condenser through a cock, a thermometer and a stirrer was charged with 19.27 parts of a phenolic hydroxyl radical-containing aromatic diamine (Diamine 2) shown below and 100 parts of cyclohexanone, which were dispersed. The acid anhydride-rich imide solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

Diamine 2

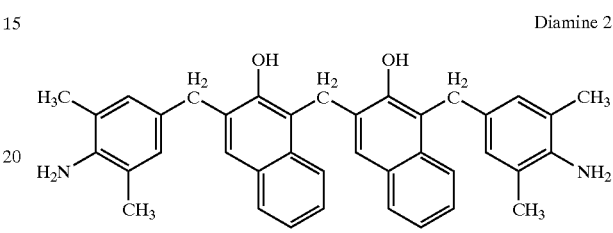

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 32,000 (polystyrene basis). Tg was 125° C. on thermo-mechanical analysis.

Synthesis Example 9

A 1-liter separable flask equipped with a 25-ml water metering receiver coupled to a reflux condenser through a cock, a thermometer and a stirrer was charged with 44.00 parts of a diaminosiloxane KF-8010 (Shin-Etsu Chemical Co., Ltd.) and 100 parts of cyclohexanone as a reaction solvent. By stirring at 80° C., the diamine was dispersed. A solution of 38.70 parts of 6FDA (2,2-bis(3,4-dicarboxyphenyl)hexafluoropropane) as an acid anhydride in 100 parts of cyclohexanone was added dropwise to the dispersion. The solution was stirred for 8 hours at 80° C. for reaction, thereby synthesizing an acid anhydride-rich amic acid oligomer.

Then 25 ml of toluene was admitted into the flask, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C., yielding an acid anhydride-rich imide solution.

Next, a 1-liter separable flask equipped with a 25-ml water metering receiver coupled to a reflux condenser through a cock, a thermometer and a stirrer was charged with 17.30 parts of a phenolic hydroxyl radical-containing aromatic diamine (Diamine 3) shown below and 100 parts of cyclohexanone, which were dispersed. The acid anhydride-rich imide solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

Diamine 3

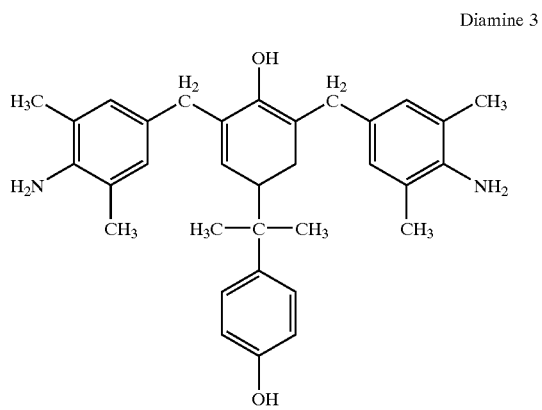

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 31,000 (polystyrene basis). Tg was 115° C. on thermo-mechanical analysis.

Synthesis Example 10

A 1-liter separable flask equipped with a 25-ml water metering receiver coupled to a reflux condenser through a cock, a thermometer and a stirrer was charged with 43.07 parts of a diaminosiloxane KF-8010 (Shin-Etsu Chemical Co., Ltd.) and 100 parts of cyclohexanone as a reaction solvent. By stirring at 80° C., the diamine was dispersed. A solution of 37.88 parts of 6FDA (2,2-bis(3,4-dicarboxyphenyl)hexafluoropropane) as an acid anhydride in 100 parts of cyclohexanone was added dropwise to the dispersion. The solution was stirred for 8 hours at 80° C. for reaction, thereby synthesizing an acid anhydride-rich amic acid oligomer.

Then 25 ml of toluene was admitted into the flask, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C., yielding an acid anhydride-rich imide solution.

Next, a 1-liter separable flask equipped with a 25-ml water metering receiver coupled to a reflux condenser through a cock, a thermometer and a stirrer was charged with 19.05 parts of a phenolic hydroxyl radical-containing aromatic diamine (Diamine 4) shown below and 100 parts of cyclohexanone, which were dispersed. The acid anhydride-rich imide solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and no outflow of water was observed. While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

Diamine 4

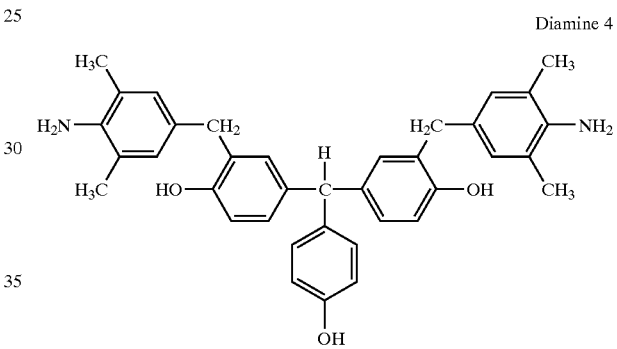

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 31,000 (polystyrene basis). Tg was 115° C. on thermo-mechanical analysis.

Note that Synthesis Example is often abbreviated as SE, hereinafter.

TABLE 1

Formulation and measured properties of Synthesis Examples 1–10

| Components (pbw) | Synthesis Example 1 | Synthesis Example 2 | Synthesis Example 3 | Synthesis Example 4 | Synthesis Example 5 |
|---|---|---|---|---|---|
| 6FDA | 38.72 | 38.72 | 38.72 | 39.19 | 39.43 |
|  | (50 mol %) | (50 mol %) | (50 mol %) | (50 mol %) | (50 mol %) |
| KF-8010 | 44.03 | 44.03 | 44.03 | 44.56 | 44.82 |
|  | (30 mol %) | (30 mol %) | (30 mol %) | (30 mol %) | (30 mol %) |
| BAPP | 0.00 | 0.00 | 0.00 | 7.53 | 11.36 |
|  | (0 mol %) | (0 mol %) | (0 mol %) | (10 mol %) | (15 mol%) |
| Diamine 1 | 17.25 | 17.25 | 17.25 | 8.73 | 4.39 |
|  | (20 mol %) | (20 mol %) | (20 mol %) | (10 mol %) | (5 mol %) |
| HAB | 0.00 | 0.00 | 0.00 | 0.00 | 0.00 |
|  | (0 mol %) | (0 mol %) | (0 mol %) | (0 mol %) | (0 mol %) |

TABLE 1-continued

Formulation and measured properties of Synthesis Examples 1–10

| | | | | | |
|---|---|---|---|---|---|
| Cyclohexanone | 300.00 | 300.00 | 300.00 | 300.00 | 300.00 |
| Phenol equivalent | 1389 | 1389 | 1389 | 2744 | 5453 |
| Mw | 30000 | 31000 | 25000 | 32000 | 33000 |
| Tg (° C.) | 115 | 120 | 100 | 95 | 90 |
| Young's modulus (Mpas) | 1000 | 1000 | 900 | 800 | 750 |

| Components (pbw) | Synthesis Example 6 | Synthesis Example 7 | Synthesis Example 8 | Synthesis Example 9 | Synthesis Example 10 |
|---|---|---|---|---|---|
| 6FDA | 42.89 (50 mol %) | 39.67 (50 mol %) | 37.78 (50 mol %) | 38.70 (50 mol %) | 37.88 (50 mol %) |
| KF-8010 | 48.76 (30 mol %) | 45.10 (30 mol %) | 42.95 (30 mol %) | 44.00 (30 mol %) | 43.07 (30 mol %) |
| BAPP | 0.00 (0 mol %) | 15.24 (20 mol %) | 0.00 (0 mol %) | 0.00 (0 mol %) | 0.00 (0 mol %) |
| Diamine 1 | 0.00 (0 mol %) | 0.00 (0 mol %) | 0.00 (0 mol %) | 0.00 (0 mol %) | 0.00 (0 mol %) |
| HAB | 8.35 (20 mol %) | 0.00 (0 mol %) | 0.00 (0 mol %) | 0.00 (0 mol %) | 0.00 (0 mol %) |
| Diamine 2 | 0.00 (0 mol %) | 0.00 (0 mol %) | 19.27 (20 mol %) | 0.00 (0 mol %) | 0.00 (0 mol %) |
| Diamine 3 | 0.00 (0 mol %) | 0.00 (0 mol %) | 0.00 (0 mol %) | 17.30 (20 mol %) | 0.00 (0 mol %) |
| Diamine 4 | 0.00 (0 mol %) | 0.00 (0 mol %) | 0.00 (0 mol %) | 0.00 (0 mol %) | 19.05 (20 mol %) |
| Cyclohexanone | 300.00 | 300.00 | 300.00 | 300.00 | 300.00 |
| Phenol equivalent | 1250 | — | 1249 | 1390 | 842 |
| Mw | 35000 | 35000 | 32000 | 31000 | 33000 |
| Tg (° C.) | 80 | 75 | 125 | 115 | 125 |
| Young's modulus (Mpas) | 750 | 700 | 1050 | 950 | 1050 |

The preparation of polyimide specimens and the measurement of Tg and Young's modulus are described below.

Preparation of Polyimide Specimens

There were furnished supports such as organic separators and metal foils. Cyclohexanone solutions of the heat resistant polyimide resins obtained in Synthesis Examples 1 to 10 were prepared. The solutions were applied onto the supports by a casting or similar technique. The coatings were dried at 80° C. for 30 minutes to form films of 50 µm thick. The specimen films were peeled from the supports (e.g., organic separators and metal foils) and secured to stainless steel frames and heat treated at 175° C. for one hour for drying and curing. Thereafter, the supports were removed by peeling, etching or the like, leaving the desired heat resistant polyimide resin films.

Glass Transition Temperature (Tg)

Using cyclohexanone solutions of the heat resistant resin compositions obtained in Synthesis Examples 1–10, specimens were prepared as above. Each specimen was secured to a stainless steel frame and heat treated at 175° C. for one hour for drying and curing. The cured specimen of 20 mm×5 mm×50 µm (thick) was measured for Tg. Using a thermomechanical analyzer TMA-2000 (ULVAC Inc.), Tg was measured in the tensile mode under conditions: a chuck-to-chuck distance of 15 mm, a measuring temperature range of 25 to 300° C., a heating rate of 10° C./min, and a load of 10 g.

Young's Modulus

Using cyclohexanone solutions of the heat resistant resin compositions obtained in Synthesis Examples 1–10, specimens were prepared as above. Each specimen was secured to a stainless steel frame and heat treated at 175° C. for one hour for drying and curing. The cured specimen of 20 mm×5 mm×50 µm (thick) was measured for dynamic viscoelasticity. Using a dynamic viscoelasticity meter, Young's modulus at 25° C. was measured in the tensile mode under conditions: a chuck-to-chuck distance of 15 mm, a measuring temperature range of 20 to 300° C., a heating rate of 5° C./min, and a frequency of 30 Hz.

Example 1

To 20 parts of the cyclohexanone solution of polyimide obtained in Synthesis Example 1, were added 62.93 parts of o-cresol novolac epoxy resin EOCN1020 (by Nippon Kayaku Co., Ltd., 220 g/Eq), 31.07 parts of a phenol novolac resin TD2131 (Dainippon Ink & Chemicals, Inc., 110 g/Eq), 1 part of tertiary phosphorus catalyst TPP (Hokko Chemical Co., Ltd.) and 295.00 parts of cyclohexanone so as to give a solids level of 25% by weight as shown in Table 2. The ingredients were agitated to form a heat resistant resin composition.

The composition was examined for Tg, Young's modulus, and bond strength before and after PCT. The results are also shown in Table 2.

Examples 2–9

To the cyclohexanone solutions of polyimides obtained in Synthesis Examples 1, 2, 4, 5, 8, 9 and 10, were added o-cresol novolac epoxy resin EOCN1020, phenol novolac resin TD2131, tertiary phosphorus curing catalyst and cyclohexanone in proportions as shown in Table 2. The ingredients were agitated to form heat resistant resin compositions. They were examined by the same tests as in Example 1. The results are also shown in Table 2.

Comparative Examples 1–7

To the cyclohexanone solutions of polyimides obtained in Synthesis Examples 3, 6 and 7, were added o-cresol novolac epoxy resin EOCN1020, phenol novolac resin TD2131, tertiary phosphorus curing catalyst and cyclohexanone in proportions as shown in Table 3. The ingredients were agitated to form heat resistant resin compositions. They were examined by the same tests as in Example 1. The results are also shown in Table 3.

TABLE 2

| Ingredients (pbw) | Example 1 | Example 2 | Example 3 | Example 4 | Example 5 | Example 6 |
|---|---|---|---|---|---|---|
| Polyimide, wt % based on solids | 5% | 50% | 85% | 85% | 85% | 85% |
| EOCN1020 | 62.93 | 35.64 | 14.42 | 14.42 | 14.42 | 12.20 |
| TD2131 | 31.07 | 13.86 | 0.48 | 0.48 | 0.48 | 2.70 |
| TPP | 1.00 | 0.50 | 0.10 | 0.10 | 0.10 | 0.10 |
| Synthesis Example 1 solids | 5.00 | 50.00 | 85.00 | | | |
| Synthesis Example 2 solids | | | | 85.00 | | |
| Synthesis Example 4 solids | | | | | 85.00 | |
| Synthesis Example 5 solids | | | | | | 85.00 |
| Cyclohexanone | 300.00 | 300.00 | 300.00 | 300.00 | 300.00 | 300.00 |
| Tg (° C.) | 150 | 145 | 140 | 140 | 110 | 105 |
| Young's modulus (Mpas) | 1800 | 1600 | 1050 | 1050 | 950 | 800 |
| Bond strength (kgf/cm²) | 20.0 | 12.0 | 7.0 | 8.0 | 6.0 | 5.0 |
| Post-PCT bond strength (kgf/cm²) | 17.0 | 11.0 | 7.0 | 8.0 | 6.0 | 5.0 |

| Ingredients (pbw) | Example 7 | Example 8 | Example 9 |
|---|---|---|---|
| Polyimide, wt % based on solids | 85% | 85% | 85% |
| EOCN1020 | 14.42 | 14.90 | 14.42 |
| TD2131 | 0.48 | 0.00 | 0.48 |
| TPP | 0.10 | 0.10 | 0.10 |
| Synthesis Example 8 solids | 85.00 | | |
| Synthesis Example 9 solids | | 85.00 | |
| Synthesis Example 10 solids | | | 85.00 |
| Cyclohexanone | 300.00 | 300.00 | 300.00 |
| Tg (° C.) | 145 | 140 | 160 |
| Young's modulus (Mpas) | 1050 | 1000 | 1300 |
| Bond strength (kgf/cm²) | 7.0 | 7.5 | 6.5 |
| Post-PCT bond strength (kgf/cm²) | 7.0 | 7.5 | 6.5 |

TABLE 3

| Ingredients (pbw) | Comparative Example 1 | Comparative Example 2 | Comparative Example 3 | Comparative Example 4 |
|---|---|---|---|---|
| Polyimide, wt % based on solids | 5% | 9% | 16% | 5% |
| EOCN1020 | 62.96 | 35.93 | 14.92 | 62.67 |
| TD2131 | 31.04 | 13.57 | 0.00 | 31.33 |
| TPP | 1.00 | 0.50 | 0.10 | 1.00 |
| Synthesis Example 3 solids | | | | |
| Synthesis Example 6 solids | 5.00 | 50.00 | 85.00 | |
| Synthesis Example 7 solids | | | | 5.00 |
| Cyclohexanone | 300.00 | 300.00 | 300.00 | 300.00 |
| Tg (° C.) | 140 | 135 | 130 | 135 |
| Young's modulus (Mpas) | 1700 | 1500 | 1000 | 1800 |
| Bond strength (kgf/cm²) | 18.0 | 10.0 | 6.0 | 16.0 |
| Post-PCT bond strength (kgf/cm²) | 6.0 | 3.0 | 2.0 | 5.0 |

| Ingredients (pbw) | Comparative Example 5 | Comparative Example 6 | Comparative Example 7 |
|---|---|---|---|
| Polyimide, wt % based on solids | 50% | 85% | 85% |
| EOCN1020 | 33.00 | 9.93 | 14.42 |
| TD2131 | 16.50 | 4.97 | 0.48 |
| TPP | 0.50 | 0.10 | 0.10 |
| Synthesis Example 3 solids | | | 85.00 |
| Synthesis Example 6 solids | | | |
| Synthesis Example 7 solids | 50.00 | 85.00 | |
| Cyolohexanone | 300.00 | 300.00 | 300.00 |
| Tg (° C.) | 100 | 90 | 140 |
| Young's modulus (Mpas) | 1500 | 800 | 1050 |
| Bond strength (kgf/cm²) | 9.0 | 6.0 | 6.5 |
| Post-PCT bond strength (kgf/cm²) | 2.0 | 1.0 | 3.5 |

Preparation of Polyimide Resin Composition Specimens

There were furnished supports such as organic separators and metal foils. Cyclohexanone solutions of the polyimide resin compositions obtained in Examples 1–9 and Comparative Examples 1–7 were prepared. The solutions were applied onto the supports by a casting or similar technique. The coatings were dried at 80° C. for 30 minutes to form films of 50 μm thick. The adhesive films were peeled from the supports (e.g., organic separators and metal foils) and secured to stainless steel frames and heat treated at 175° C. for one hour for drying and curing. Thereafter, the supports were removed by peeling, etching or the like, leaving the desired polyimide resin composition specimens.

Glass Transition Temperature (Tg)

Specimens of the polyimide resin compositions obtained in Examples 1–9 and Comparative Examples 1–7 were prepared as above. Each specimen was secured to a stainless steel frame and heat treated at 175° C. for one hour for curing. The specimen of 20 mm×5 mm×50 μm (thick) was measured for Tg. Using a thermo-mechanical analyzer TMA-2000 (ULVAC Inc.), Tg was measured in the tensile mode under conditions: a chuck-to-chuck distance of 15 mm, a measuring temperature range of 25 to 300° C., a heating rate of 10° C./min, and a load of 10 g.

Young's Modulus

Specimens of the polyimide resin compositions obtained in Examples 1–9 and Comparative Examples 1–7 were prepared as above. Each specimen was secured to a stainless steel frame and heat treated at 175° C. for one hour for curing. The specimen of 20 mm×5 mm×50 μm (thick) was measured for dynamic viscoelasticity. Using a dynamic viscoelasticity meter, Young's modulus at 25° C. was measured in the tensile mode under conditions: a chuck-to-chuck distance of 15 mm, a measuring temperature range of 20 to 300° C., a heating rate of 5° C./min, and a frequency of 30 Hz.

Bond Strength

The polyimide resin composition varnishes obtained in Examples 1–9 and Comparative Examples 1–7 each were coated onto an alloy 42 plate of 18 mm×18 mm with a perforation of 5 mm×5 mm size and having a Teflon® film of 180 μm thick attached thereon. The coating was dried in an air stream at 80° C. for 30 minutes to remove the solvent. In this experiment, an alloy 42 KAKU-42 by Toppan Printing Co., Ltd. was used as a mating member. The alloy 42 plate was rested on the coated alloy 42 specimen with the polyimide resin composition sandwiched therebetween. The resulting laminate was press bonded at 150° C. and 6 kgf/cm² for one minute. The press bonded laminate was heat treated in a nitrogen stream at 80° C. for 1 hour, at 150° C. for 1 hour, and at 200° C. for 1 hour for curing the polyimide resin composition layer, obtaining a specimen for a bond strength test. The shear bond strength was measured using an autograph tensile tester (Shimadzu Mfg. Co., Ltd.) at a rate of 2.0 mm/min.

Post-PCT Bond Strength

The polyimide resin composition varnishes obtained in Examples 1–9 and Comparative Examples 1–7 each were coated onto an alloy 42 plate of 18 mm×18 mm with a perforation of 5 mm×5 mm size and having a Teflon® film of 180 μm thick attached thereon. The coating was dried in an air stream at 80° C. for 30 minutes to remove the solvent. In this experiment, an alloy 42 KAKU-42 by Toppan Printing Co., Ltd. was used as a mating member. The alloy 42 plate was rested on the coated alloy 42 specimen with the polyimide resin composition sandwiched therebetween. The resulting laminate was press bonded at 150° C. and 6 kgf/cm² for one minute. The press bonded laminate was heat treated in a nitrogen stream at 80° C. for 1 hour, at 150° C. for 1 hour, and at 200° C. for 1 hour for curing the polyimide resin composition layer, obtaining a specimen for a bond strength test. The specimen was held for 24 hours under pressure cooker test (PCT) conditions before the shear bond strength was measured using an autograph tensile tester (Shimadzu Mfg. Co., Ltd.) at a rate of 2.0 mm/min.

There have been described polyimide resins and polyimide resin compositions which are suited for use as varnish, adhesive and adhesive film for which adhesion and heat resistance are required and will find widespread use in paint, circuit board, electric, automotive, building and construction fields. As compared with prior art resins, the inventive polyimide resins not only have heat resistance, but also exhibit good drying, film forming and electrical properties. When the resin composition is used in the form of an adhesive film as an interlaminar insulating adhesive, thermal degradation of mechanical properties is prevented, and interlaminar insulation resistance and reliability under heat are improved. The resin compositions can be used in high-temperature processes that prior art resins cannot withstand.

Japanese Patent Application No. 2002-211425 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:
1. A polyimide resin comprising recurring units of the following structural formulae (1) and (2) and prepared using a diamine bearing an aromatic ring having an amino radical attached thereto and another aromatic ring having a phenolic hydroxyl radical so that the polyimide resin has phenolic hydroxyl radicals in its skeleton,

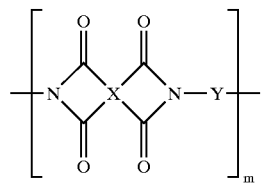

(1)

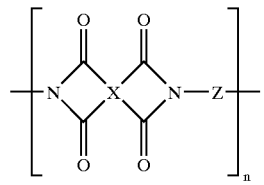

(2)

wherein X is at least one tetravalent organic radical selected from the group [I]; Y is a divalent organic radical comprising a diamine residue $Y_1$ having a phenolic hydroxyl radical represented by the formula [II] and an aromatic diamine residue $Y_2$ selected from the group [III]; Z is a siloxane diamine residue represented by the formula [IV]; $Y_1/(Y_1+Y_2)$ being from 0.01 to 1 in a molar ratio, m and n are natural numbers, satisfying $0.1 \leq m/(m+n) \leq 0.99$ and $10 \leq m+n \leq 500$, Group (I)

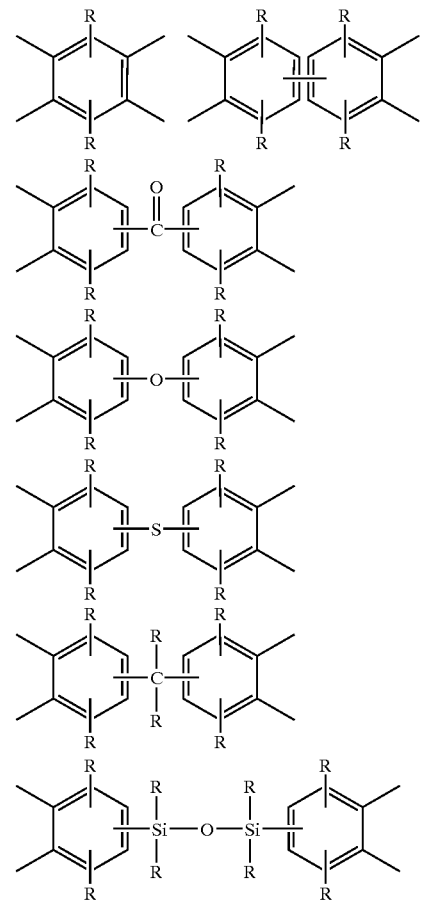

-continued
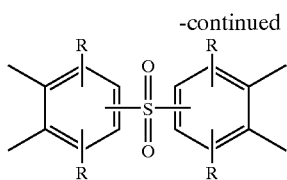
wherein R is independently a hydrogen atom, halogen atom or substituted or unsubstituted monovalent hydrocarbon radical of 1 to 8 carbon atoms,
Formula (II)
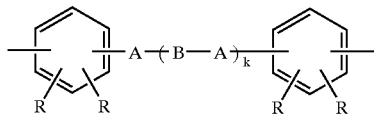
wherein A is a radical selected from the group [IIa] and B is a radical selected from the group [IIb]:
Group (IIa)
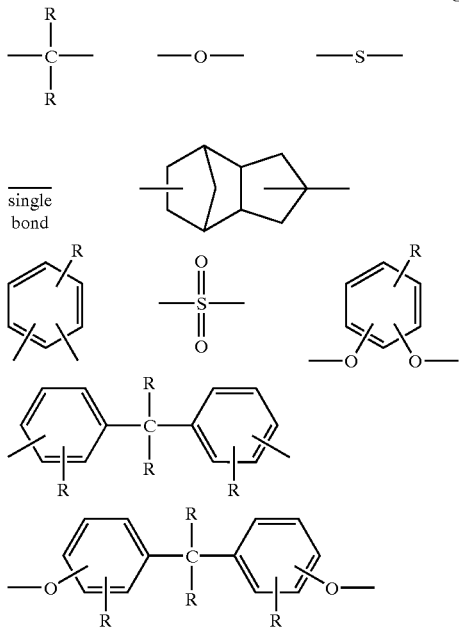
Group (IIb)
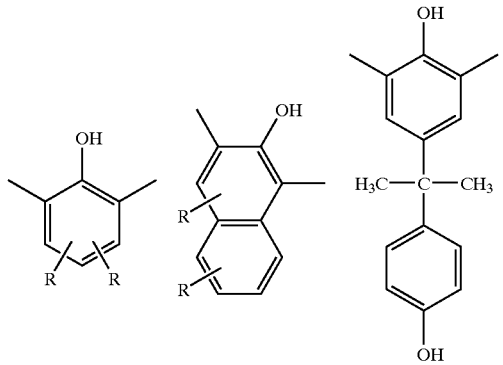
-continued
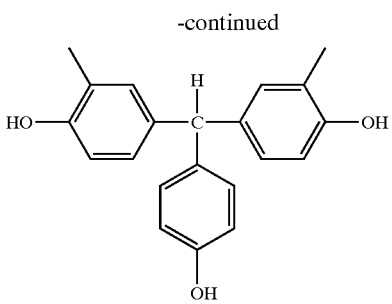
R is as defined above, and k is a natural number of 1 to 5,
Group (III)
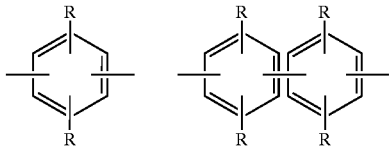
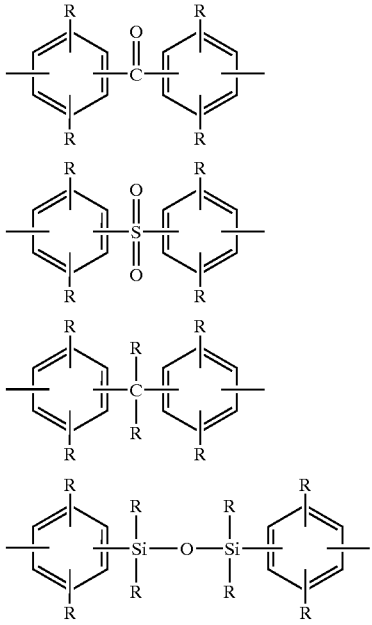
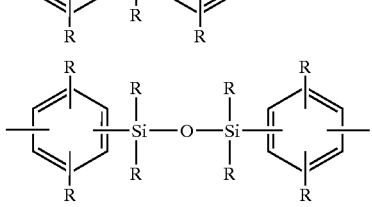
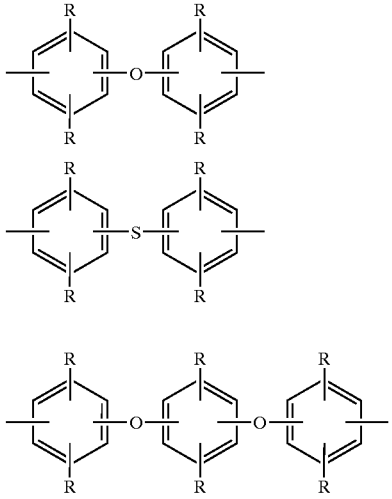

-continued

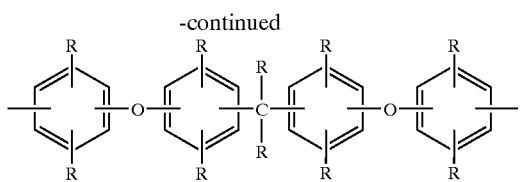

wherein R is as defined above,

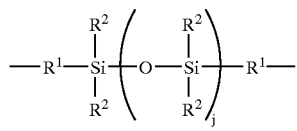
Formula (IV)

wherein $R^1$ is independently a $C_{1-8}$ alkylene or arylene radical, $R^2$ is independently a $C_{1-8}$ alkyl, alkoxy or aryl radical, and j is an integer of 4 to 60.

2. A method for preparing the polyimide resin of claim 1, comprising reacting a tetracarboxylic acid dianhydride having the general formula (3):

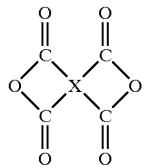 (3)

or its precursor, a tetracarboxylic acid or ester derivative thereof with diamines having the general formulae (4), (5) and (6)

$H_2N-Y_1-NH_2$ (4), $H_2N-Y_2-NH_2$ (5)

$H_2N-Z-NH_2$ (6), wherein X, $Y_1$, $Y_2$ and Z are as defined above, with the proviso that the amounts of diamines of formulae (4), (5) and (6) used are $Y_1$ moles, $Y_2$ moles and z moles, respectively, $y_1/(y_1+y_2)$ is from 0.01 to 1, and $(y_1+y_2)/(y_1+y_2+z)$ is from 0.1 to 0.99, under such conditions as to give a molar ratio of P/Q>1 wherein P is the amino radical on the diamine of formula (4) and Q is the acid anhydride residue (or 2 equivalents of carboxylic acid radical or ester radical) on the tetracarboxylic acid dianhydride of formula (3).

3. A polyimide resin composition comprising the polyimide resin of claim 1.

4. The polyimide resin composition of claim 3, further comprising an epoxy resin having at least two glycidyl radicals.

5. The polyimide resin composition of claim 4, further comprising an epoxy resin curing agent.

6. The polyimide resin composition of claim 5, wherein the chemical equivalent ratio of the sum of the epoxy resin curing agent and the polyimide resin having phenolic hydroxyl radicals in its skeleton to the epoxy resin is in the range of between 0.7 and 1.3.

7. The polyimide resin composition of claim 3, wherein the polyimide resin composition is dissolvable in an aprotic polar solvent.

8. The polyimide resin composition of claim 7, wherein the solvent is cyclohexanone.

9. A coating film comprising the polyimide resin composition of claim 3 coated to a substrate and wherein the coating film is adhesive to copper foil.

* * * * *